United States Patent [19]

Nakanishi

[11] Patent Number: 5,778,311
[45] Date of Patent: Jul. 7, 1998

[54] INTERMITTENT OPERATION RECEIVER WITH VARIABLE PRE-HEAT TIME FOR ITS PHASE-LOCKED CIRCUIT

[75] Inventor: Hideo Nakanishi, Yokohama, Japan

[73] Assignee: Matsushita Electric Industrial Co., Ltd., Osaka, Japan

[21] Appl. No.: 671,597

[22] Filed: Jun. 28, 1996

[30] Foreign Application Priority Data

Jun. 30, 1995 [JP] Japan .................................. 7-186627

[51] Int. Cl.$^6$ .............................................. H04B 1/16
[52] U.S. Cl. ........................... 455/343; 455/260; 370/311
[58] Field of Search ................................ 455/38.1, 38.3, 455/127, 260, 226.1, 230, 231, 324, 343; 331/14; 370/311; 340/825.44

[56] References Cited

U.S. PATENT DOCUMENTS

| | | | |
|---|---|---|---|
| 4,384,361 | 5/1983 | Masaki | 455/343 |
| 4,777,655 | 10/1988 | Numata et al. | 455/260 |
| 5,402,446 | 3/1995 | Minami | 455/260 |
| 5,448,774 | 9/1995 | Yokozaki et al. | 455/343 |
| 5,636,243 | 6/1997 | Tanaka | 455/343 |

FOREIGN PATENT DOCUMENTS

| | | |
|---|---|---|
| 0594403 | 4/1994 | European Pat. Off. . |
| 1265726 | 10/1989 | Japan . |
| 6350509 | 12/1994 | Japan . |

*Primary Examiner*—Edward F. Urban
*Attorney, Agent, or Firm*—Pollock, Vande Sande & Priddy

[57] ABSTRACT

An intermittent operation receiver comprises a receiving circuit 8 receiving one of plural intermittent receiving operation information and data transmitted from a base station and generating its demodulated signal 24, a PLL circuit 7 including a voltage-controlled oscillator 5 and generating two kinds of local signals 25 and 26 different 90° in their phases which are sent to the receiving circuit 8 to process the input signal, and a data processing section 14 which receives the demodulated signal 24 from the receiving circuit 8, decodes the data to generate a first intermittent cycle generation timing signal 18 including a period corresponding to the cycle information of the intermittent receiving operation, and sends this first intermittent cycle generation timing signal 18 to receiving circuit 8 to control the power supply from its power source unit. Meanwhile, data processing section 14 selectively determines a pre-heat time t1, t2 or t3 in accordance with the designated intermittent operating cycle, generates a second intermittent cycle generation timing signal 19 involving the timing of the pre-heat time, and sends this second intermittent cycle generation timing signal 19 to the PLL circuit 7 to control the power supply from its power source unit.

4 Claims, 5 Drawing Sheets

INTERMITTENT OPERATION RECEIVER WITH VARIABLE PRE-HEAT TIME FOR ITS PHASE-LOCKED CIRCUIT

BACKGROUND OF THE INVENTION

1. Field of the Invention

This invention generally relates to a small size radio receiver, such as a pager, and more particularly to an intermittent operation receiver capable of responding to a signal transmitting/receiving system characterized by an intermittent receiving operation whose operating cycle is not fixed and rather variable.

2. Prior Art

Conventional intermittent operation receivers are generally equipped with a special function for activating their receiving sections intermittently to lengthen the lifetime of their batteries. FIGS. 5 through 7 show an example of this kind of conventional intermittent operation receiver. FIG. 5 is a schematic block diagram showing an intermittent operation receiver applied to a conventional direct-conversion type receiver. FIG. 6 is a graph showing a frequency stabilization time of a PLL circuit used in this conventional intermittent operation receiver in relation to an intermittent operating cycle of this conventional intermittent operation receiver together with a given stationary pre-heat time in accordance with this conventional technology. FIG. 7 is a timing chart showing a correlation between an operation timing of a receiver circuit and an operation timing of the PLL circuit in connection with the behavior of the frequency convergence of the PLL circuit.

In FIG. 5, an antenna 10 receives a radio frequency (RF) signal such as an FSK signal or the like. An RF amplifier 11 amplifies the input signal received by antenna 10. An orthogonal mixer 12 resolves the amplified input signal in response to local signals 34 and 35 (later-described) which are supplied from a PLL circuit 7 and offset 90° in their phases. More specifically, this orthogonal mixer 12 generates an I signal and an Q signal which are different 90° in their phases. A demodulation IC 13 receives and demodulates the I signal and Q signal to generate an NRZ (non return to zero) signal 24. A decoder 9 receives the NRZ signal 24 and generates various signals which are, for example, displayed as images on a liquid crystal display unit through a liquid crystal processing section or D/A converting section (both not shown) or are generated as sounds from a speaker.

A first intermittent cycle generating section 16 generates a first intermittent cycle generation timing signal 18 which is used to turn on and turn off the power source unit intermittently at the predetermined intervals (sT shown in FIG. 7). A second intermittent cycle generating section 30 generates a second intermittent cycle generating timing signal 31 including a stationary pre-heat time which is used to turn on and turn off the power source unit intermittently at the intervals identical with the first intermittent cycle generation timing signal 18. A first regulator circuit 20 intermittently supplies a first power voltage 22 serving as a receiving power voltage from the power source unit (not shown) to a receiving circuit 8, including RF amplifier 11, orthogonal mixer 12, demodulation IC 13 and others, in synchronism with the first intermittent cycle generation timing signal 18. A second regulator circuit 21 intermittently supplies a second power voltage 33 serving as a pre-heat voltage from the power source unit (not shown) to PLL circuit 7 at stationary intervals (i.e. at the constant cycle) in response to the second intermittent cycle generation timing signal 31.

PLL circuit 7 receives a second power voltage 33 and is heated during a predetermined time (i.e. stationary per-heat time). Then, after completing the pre-heat operation, PLL circuit 7 sends out local signals (i.e. local oscillation signals) 34 and 35, whose phases are offset from each other by 90°, to orthogonal mixer 12 which is activated by first power voltage 22 after completing the pre-heat operation, thereby resolving the input signal into I signal and Q signal. More specifically, the generation of a second power voltage 33 is earlier than the build-up of first power voltage 22 by a time equivalent to the pre-heat time set for the pre-heating operation of PLL circuit 7. A frequency convergence or output convergence time, starting from a time PLL circuit 7 first receives second power voltage 33 and ending at a time receiving circuit 8 starts its receiving operation, is set at a value to stably converge the frequency output of local signals 34 and 35 generated from PLL circuit 7. Details of the frequency convergence will be explained later.

RF amplifier 11, orthogonal mixer 12, demodulation IC 13, first regulator circuit 20, second regulator circuit 21 and others cooperatively constitute receiving circuit 8. Meanwhile, decoder 9, first intermittent cycle generating section 16, second intermittent cycle generating section 30 and others cooperatively constitute data processing section 32.

Next, with reference to FIGS. 5 through 7, an operation of the above-described conventional apparatus will be explained. First of all, its intermittent receiving operation will be explained. A conventional intermittent receiving operation, performed during a receiving time, is normally operated by a constant cycle. For example, the signal transmitting/receiving system standardized by NTT format (RCR STD-41) is given a cycle of approximately 28 sec. In the case of POCSAG format (RCR STD-42), the intermittent receiving operation is performed by a cycle of approximately 0.5 sec. In short, transmission information including dial information, for example, transmitted from a relay center, are received at the intervals determined by this cycle.

As shown in FIG. 7, second intermittent cycle generating section 30 sends second regulator circuit 21 the second intermittent cycle generation timing signal 31 which is generated earlier than the first intermittent cycle generation timing signal 18 by an amount equivalent to the pre-heat time being set. Second regulator circuit 21 sends the second power voltage 33 to PLL circuit 7 in response to this signal. Namely, generation of the second power voltage 33 is identical with the operation timing of PLL circuit 7 shown in FIG. 7.

PLL circuit 7 comprises a voltage-controlled oscillator (VCO). As shown in FIG. 7, it takes a significant (constant) time to stabilize the output oscillation frequency as indicated by a curve illustrating the behavior of the frequency convergence of PLL circuit 7. This is why the pre-heat time having a sufficient length covering the frequency stabilization time of PLL circuit 7 is provided before the first power voltage is first supplied to receiving circuit 8. After the passage of this pre-heat time, orthogonal mixer 12 is controlled by local signals 34 and 35 which are frequency outputs of PLL circuit 7.

Meanwhile, the receiving operation is carried out in the following manner. In synchronism with the intermittent receiving operation controlled by a given cycle determined by the above-described format, receiving circuit 8 starts its receiving operation as soon as first regulator circuit 20 supplies the first power voltage 22 to receiving circuit 8 in response to the first intermittent cycle generation timing signal 18 outputted from first intermittent cycle generating section 16. Namely, the operation of receiving circuit 8 shown in FIG. 7 is started at a time "A" in response to the generation of first power voltage 22 and is performed intermittently until a start time "B" for the next operation.

More specifically, during a time the first power voltage 22 is applied, the radio frequency signal received by antenna 10 is amplified by RF amplifier 11. The amplified input signal is orthogonally resolved into the base-band I and Q signals in orthogonal mixer 12 under the control of local signals 34 and 35 fed from a phase shifter of PLL circuit 7. Then, the base-band I and Q signals are detected and demodulated in demodulation IC 13 into the NRZ signal 24 which is subsequently sent out to decoder 9.

FIG. 6 is a graph showing a frequency stabilization time of the PLL circuit in relation to the intermittent operation cycle (sT) under a given stationary pre-heat time (which is equivalent to a time difference between the power build-up of receiving circuit 8 and the power build-up of PLL circuit 7). As understood from an ascending curve showing the frequency stabilization time, a time required for stabilizing the frequency output is generally increased with increasing intermittent operating cycle (sT). However, it will be sufficient if the pre-heat time is set higher than the required frequency stabilization time (i.e. the pre-heat time is set longer than the required frequency stabilization time).

According to the signal transmitting/receiving system applied to the above-described intermittent operation receiver, its intermittent operating cycle (sT) is fixed and, hence, it is possible that the power voltage supplied to the PLL circuit has a pre-heat time suitable or matching with this fixed cycle.

However, if this intermittent operation receiver is required to flexibly respond to other signal transmitting/receiving signals capable of varying the cycle of its intermittent receiving operation, the following problems will be derived from the nature of the fixed or constant pre-heat time.

That is, the frequency stabilization time of the PLL circuit is normally elongated with increasing intermittent operating cycle for the following reason. An amount of electric charge, leaking from a capacitor in a lag-lead element of a low-pass filter (LPF) used in the PLL circuit, is increased in proportion to the time elapse starting after turn-off of the power source unit. Hence, when the cycle of the intermittent receiving operation is increased, the elapsed time passing after the power is turned off is increased correspondingly. Accordingly, it takes a long time to restore the charge of the capacitor when the power is next turned on, resulting in an elongation of the frequency stabilization time.

For this reason, regarding the pre-heat time to be added to the build-up of the power voltage supplied to the PLL circuit, the conventional method will cause the following problem since the pre-heat time is maintained at a stationary value. As described above, the pre-heat time is a time difference between the power build-up of the PLL circuit and the power build-up of the receiving circuit.

In FIG. 6, if the cycle of the intermittent receiving operation is increased (i.e. if the cycle sT shifts right in the drawing), the frequency stabilization time shifts upward correspondingly in the drawing. If the frequency stabilization time becomes longer than the pre-heat time (stationary value), the receiving circuit starts its operation before the frequency convergence of the PLL circuit is not sufficiently stabilized. On the contrary, if the pre-heat time is set to a long value corresponding to a specific cycle of the longest intermittent receiving operation performable in the intermittent operation receiver, it will result in a lower efficiency of the power supply operation. This results because the pre-heat time is excessively and unnecessarily long time compared with an ordinary intermittent operating cycle, as the intermittent receiving operation is normally carried out at such cycles fairly shorter than the longest cycle (i.e. when the cycle of the intermittent receiving operation is shifted left in the drawing).

SUMMARY OF THE INVENTION

Accordingly, in view of above-described problems encountered in the prior art, a principal object of the present invention is to provide a novel and excellent intermittent operation receiver capable of varying the length of the pre-heat time in accordance with a variation of the cycle of the designated or selected intermittent receiving operation, thereby realizing a superior intermittent receiving operation assuring excellent efficiency in the power supply operation.

In order to accomplish this and other related objects, the present invention provides an intermittent operation receiver comprising: a receiving circuit for receiving a control signal including at least one of plural intermittent operating cycles and data transmitted from a base station and generating its demodulated signal: a PLL circuit including a voltage-controlled oscillator for generating two kinds of local signals different 90° in their phases which are sent to the receiving circuit to control a receiving processing; and a data processing section for receiving the demodulated signal from the receiving circuit. The processing section decodes the data and processes the control signal to generate a first intermittent cycle generation timing signal including a period corresponding to a designated intermittent operating cycle involved in the control signal, and sending out the first intermittent cycle generation timing signal to the receiving circuit to control a power supply from its power source unit. Furthermore, the data processing section selectively determines a pre-heat time in accordance with the designated intermittent operating cycle involved in the control signal, generates a second intermittent cycle generation timing signal involving a timing of the pre-heat time, and sends out the second intermittent cycle generation timing signal to the PLL circuit to control a power supply from its power source unit, thereby changing the pre-heat time of the PLL circuit in accordance with any modified intermittent operating cycle sent from the base station.

Furthermore, in order to accomplish the above-described objects, the intermittent operation receiver of the present invention further comprises a ROM for storing timing information relating to plural pre-heat times corresponding to the plural intermittent operating cycles. The data processing section reads out timing information relating to a pre-heat time corresponding to the designated intermittent operating cycle when intermittent operating cycle information is received from the base station, thereby determining a timing of the second intermittent cycle generation timing signal.

Furthermore, in order to accomplish the above-described objects, in the intermittent operation receiver of the present invention, the data processing section comprises a means for setting an initial intermittent operating cycle, so that the first and second intermittent cycle generation timing signals are determined in accordance with the initial intermittent operating cycle.

Furthermore, in order to accomplish the above-described objects, in the intermittent operation receiver of the present invention, the receiving circuit comprises: a first regulator circuit for receiving the first intermittent cycle generation timing signal from the data processing section and supplying a first power voltage to the receiving circuit in response to a timing of the first intermittent cycle generation timing signal, and a second regulator circuit for receiving the second intermittent cycle generation timing signal from the data processing section and supplying the PLL circuit with a second power voltage involving the pre-heat time in response to a timing of the second intermittent cycle generation timing signal.

As explained above, the arrangement of the present invention provides, in the data processing section, a means for setting the timing information relating to an ideal pre-heat time in response to each of plural different intermittent operating cycles, or provides a ROM connectable with the data processing section for storing such timing information. Thus, it becomes possible to realize an intermittent operation receiver capable of determining (changing) the timing information relating to the pre-heat time of the PLL circuit by the data processing section in accordance with the change of the intermittent operating cycle received from the base station, or capable of reading out the same from the ROM. Hence, the PLL circuit can always perform its receiving operation in a stable frequency convergence condition no matter how the intermittent operating cycle is changed. Thus, any redundant pre-heat time of the PLL circuit can be eliminated, while increasing the lifetime of the batteries and heightening the efficiency in the power supply operation.

BRIEF DESCRIPTION OF THE DRAWINGS

The above and other objects, features and advantages of the present invention will become more apparent from the following detailed description which is to be read in conjunction with the accompanying drawings, in which.

DETAILED DESCRIPTION OF THE PREFERRED EMBODIMENT

Figure 1:
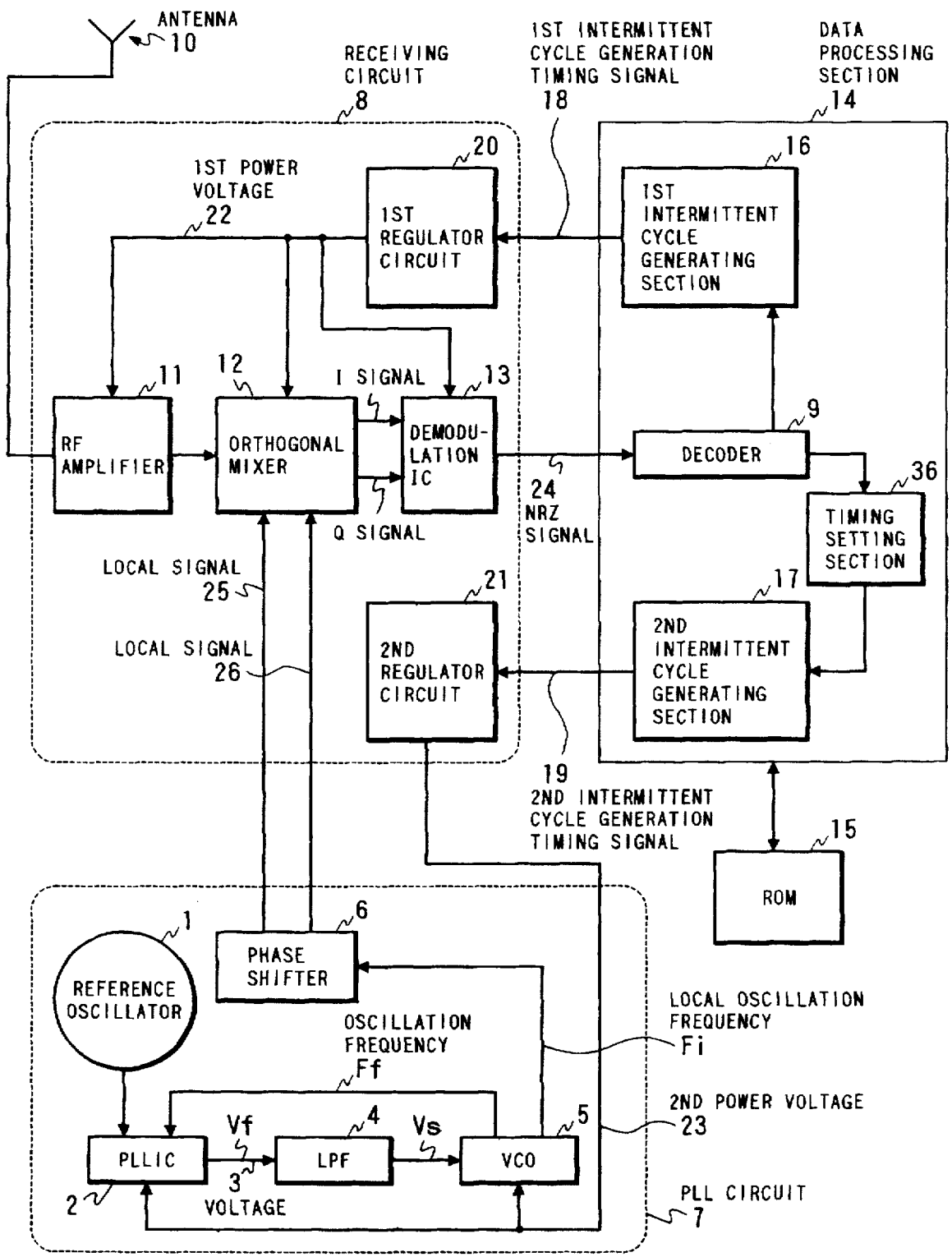
FIG. 1 is a schematic block diagram showing an intermittent operation receiver applied to a direct-conversion type receiver in accordance with one embodiment of the present invention.
Figure 2:
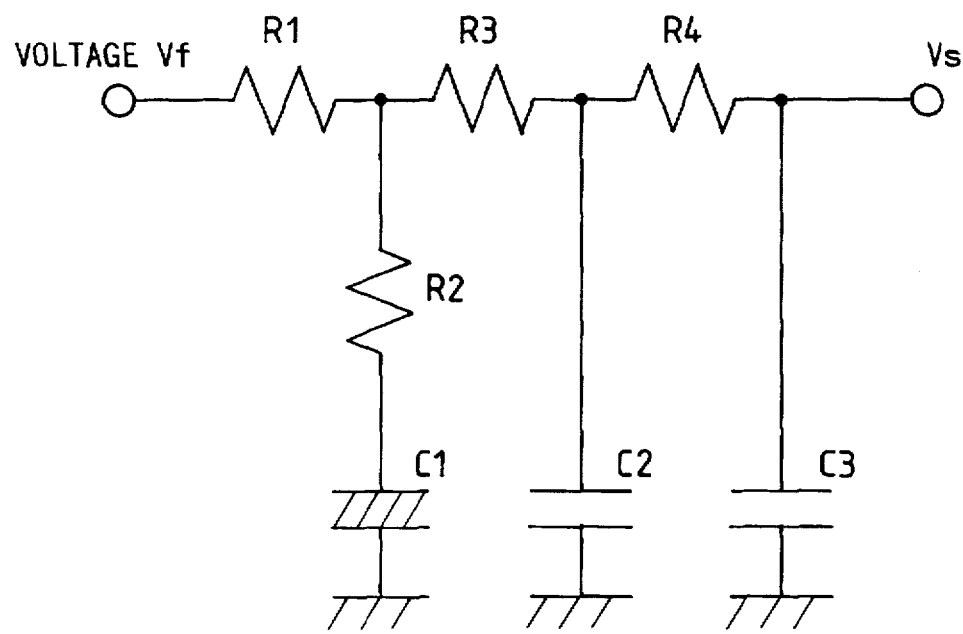
FIG. 2 is a detailed circuit diagram showing a low-pass filter (LPF) used in a PLL circuit.
Figure 3:
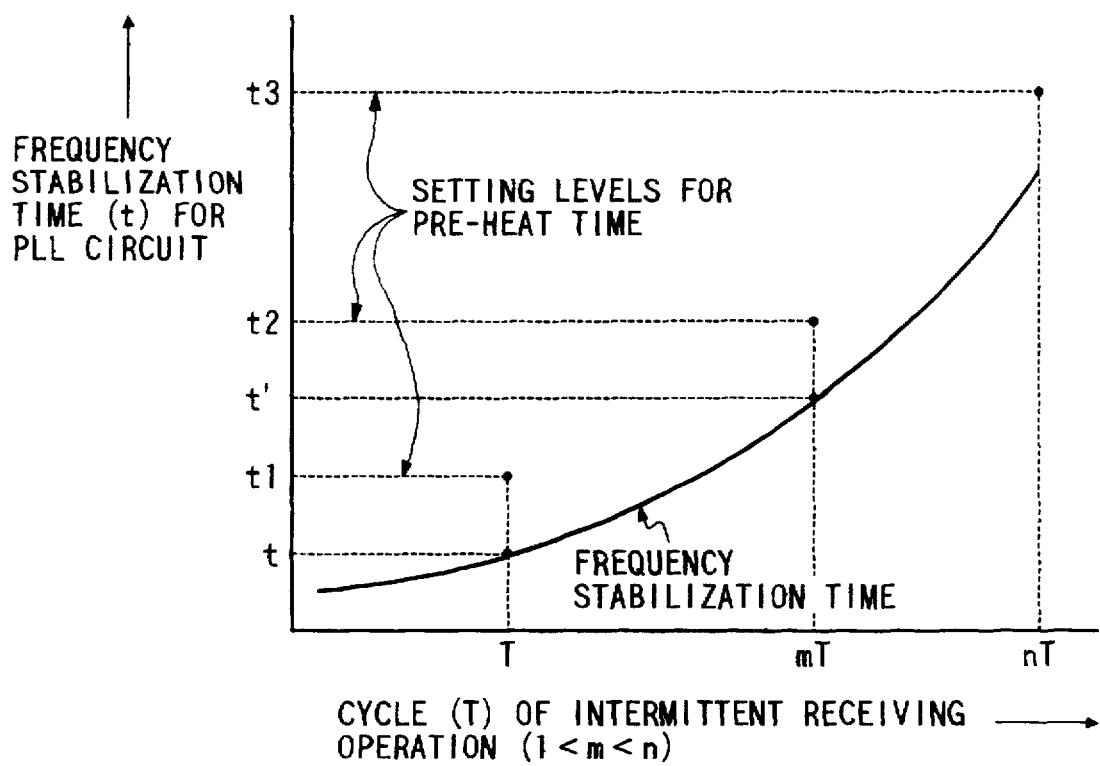
FIG. 3 is a graph showing the frequency stabilization time of the PLL circuit in relation to representative three intermittent operating cycles T, mT and nT together with corresponding variable pre-heat times in accordance with the embodiment shown in FIG. 1.
Figure 4A:
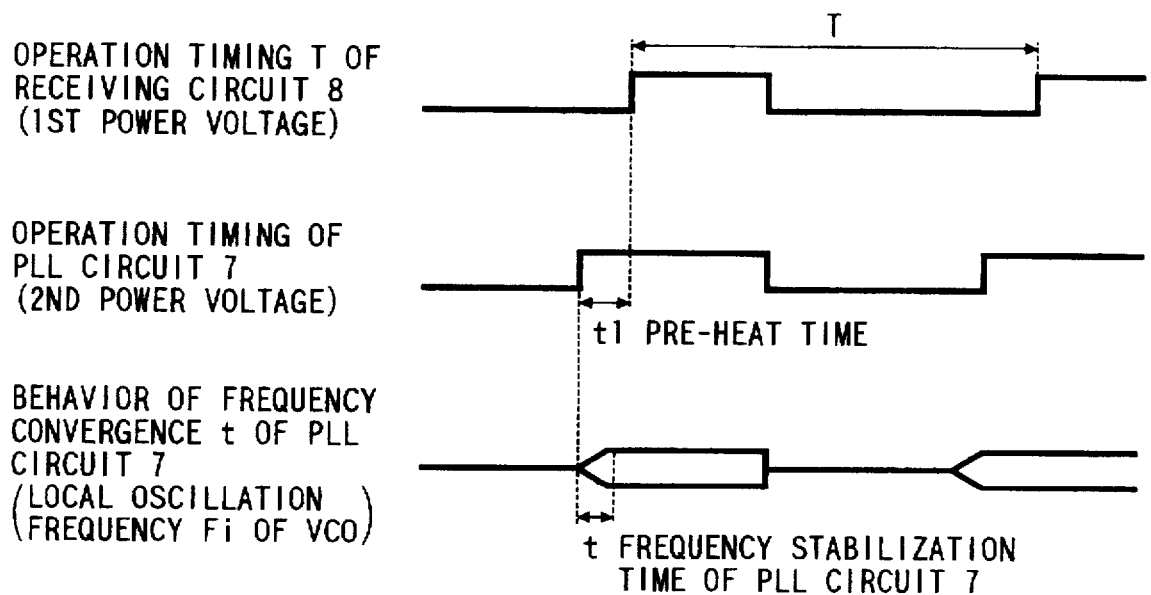
FIGS. 4A and 4B are timing charts respectively showing a correlation between the operation timing of the receiver circuit and the operation timing of the PLL circuit in connection with the behavior of the frequency convergence of the PLL circuit in accordance with the embodiment shown in FIG. 1, wherein the intermittent receiving operation is operated by the cycle T in FIG. 4A and the cycle mT in FIG. 4B.
Figure 4B:
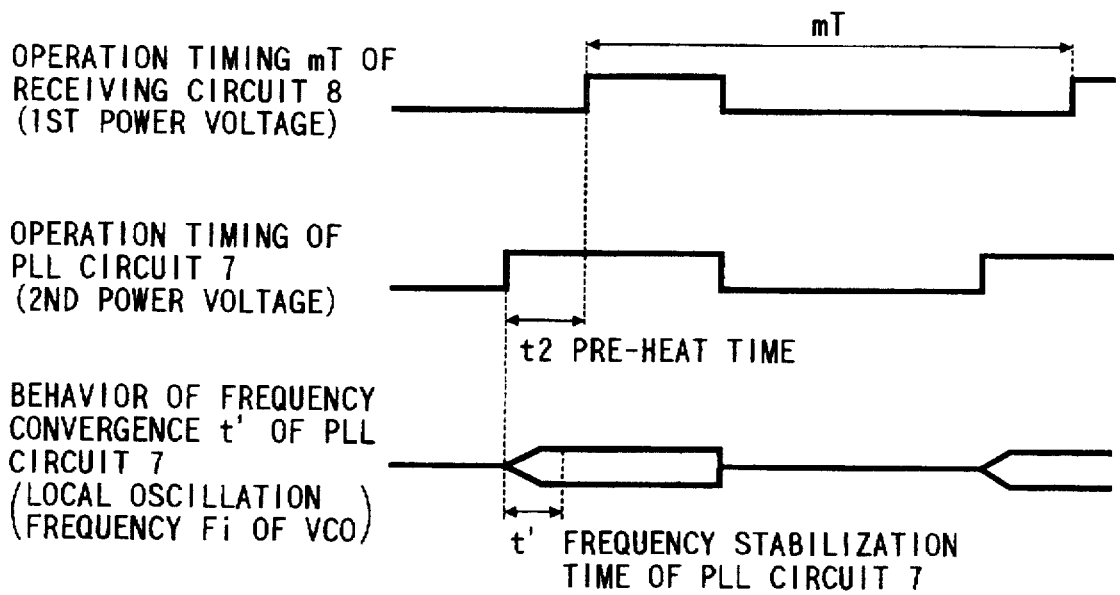

Hereinafter, an intermittent operation receiver in accordance with a preferable embodiment of the present invention will be explained in greater detail with reference to FIGS. 1 through 4 of the accompanying drawings. FIG. 1 is a schematic block diagram showing an intermittent operation receiver applied to a direct-conversion type receiver in accordance with one embodiment of the present invention. FIG. 2 is a detailed circuit diagram showing a low-pass filter (LPF) used in a PLL circuit of the intermittent operation receiver. FIG. 3 is a graph showing the frequency stabilization time of the PLL circuit in relation to representative three intermittent operating cycles T, mT and nT together with corresponding variable pre-heat times in accordance with the embodiment shown in FIG. 1. FIGS. 4A and 4B are timing charts respectively showing a correlation between the operation timing of the receiver circuit and the operation timing of the PLL circuit in connection with the behavior of the frequency convergence of the PLL circuit in accordance with the embodiment of FIG. 1, wherein the intermittent receiving operation is operated by the cycle T in FIG. 4A and the cycle mT in FIG. 4B.

Figure 5:
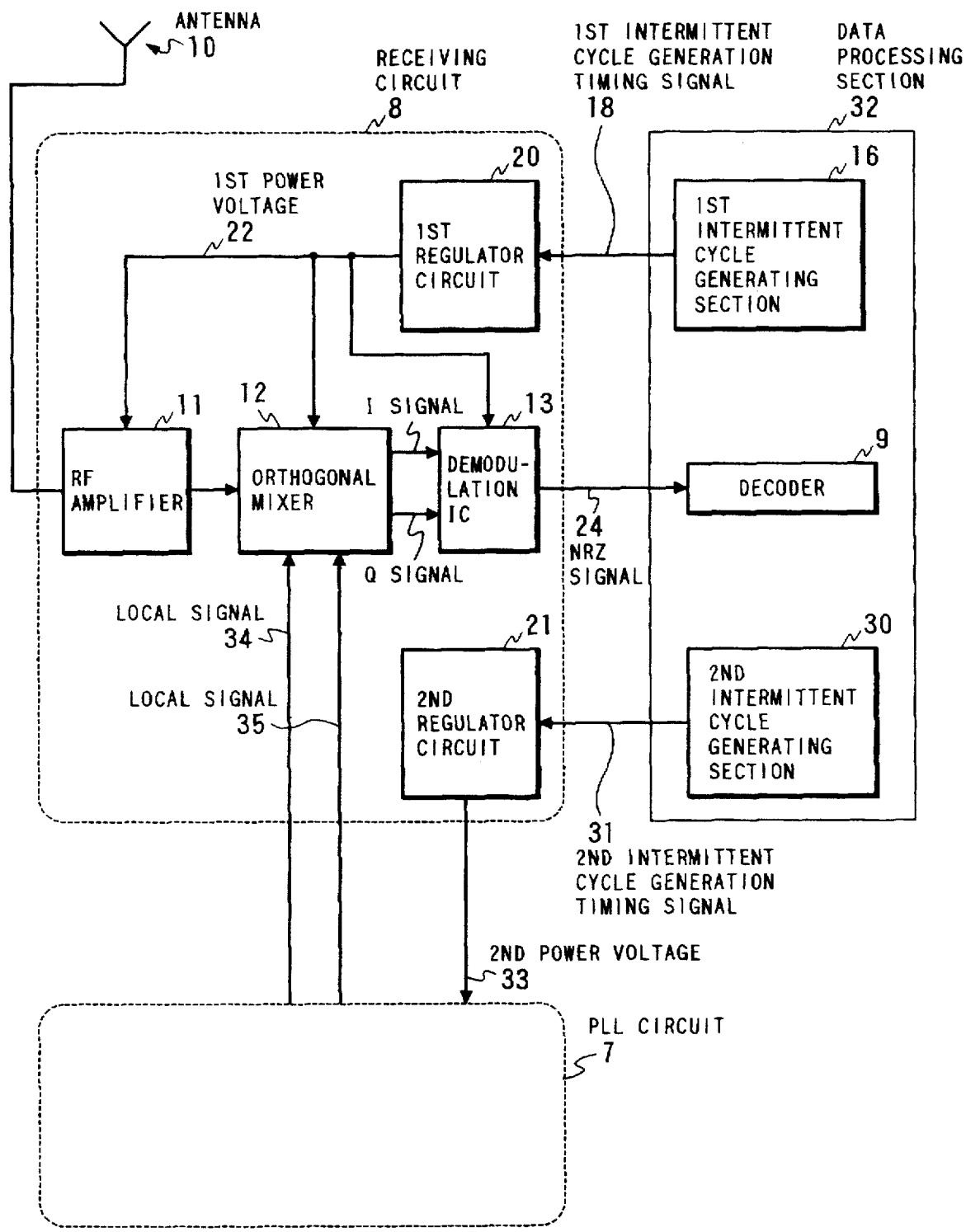
FIG. 5 is a schematic block diagram showing an intermittent operation receiver applied to a conventional direct-conversion type receiver.
Figure 6:
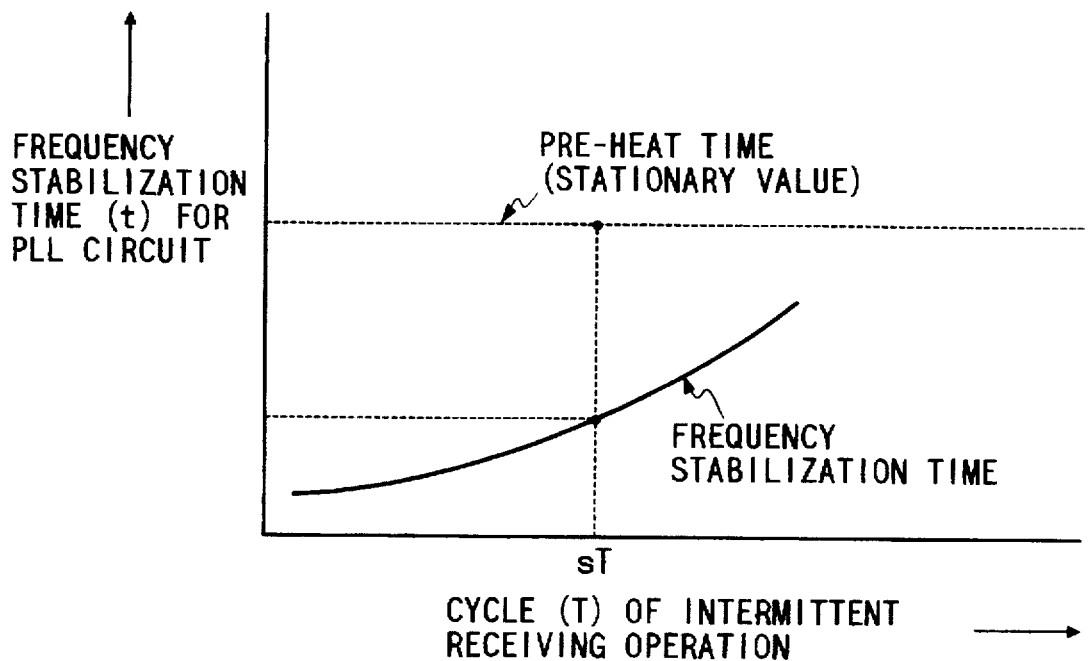
FIG. 6 is a graph showing a frequency stabilization time of a PLL circuit in relation to an intermittent operating cycle under a given stationary pre-heat time in accordance with this conventional technology.
Figure 7:
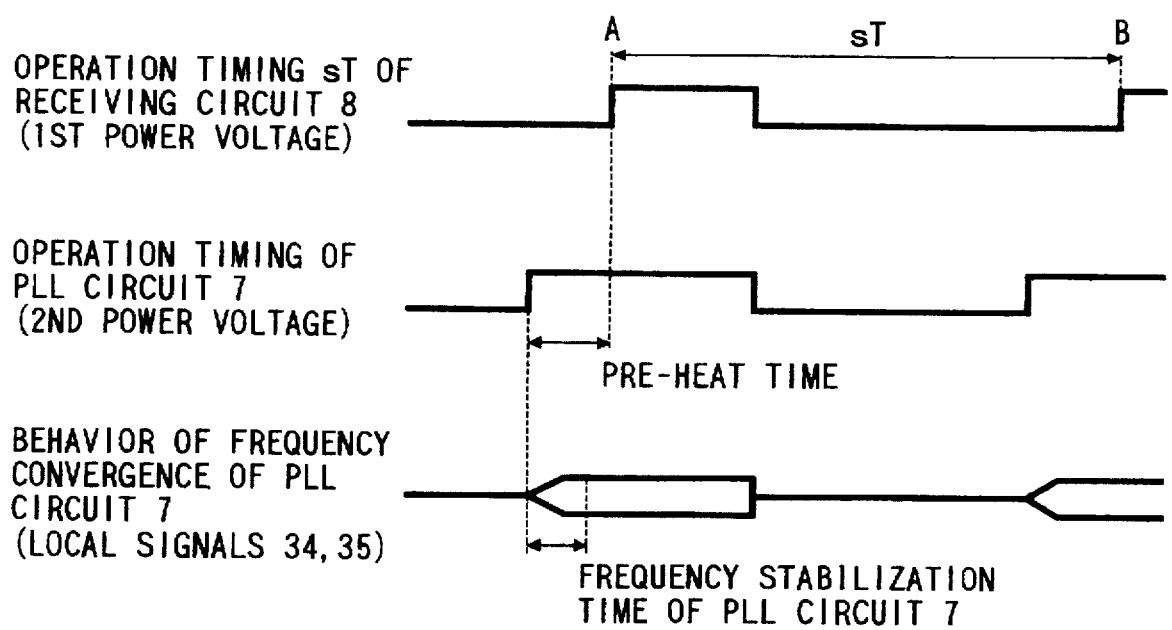
FIG. 7 is a timing chart showing a correlation between an operation timing of a receiver circuit and an operation timing of the PLL circuit in connection with the behavior of the frequency convergence of the PLL circuit.

An arrangement of the intermittent operation receiver of the preferred embodiment will be hereinafter explained with reference to FIGS. 1 and 2. In FIG. 1, antenna 10, RF amplifier 11, orthogonal mixer 12, demodulation IC 13, first regulator circuit 20 and second regulator circuit 21 respectively involved in receiving circuit 8 are identical with those of the -conventional intermittent operation receiver explained with reference to FIG. 5 and therefore will not be explained again, as well as decoder 9 and first intermittent cycle generating section 16 provided in data processing section 14. However, it should be noted that control information (including data) sent from a base station is essentially an information signal comprising a cycle of one intermittent receiving operation designated or selected from a plurality of cycles of variable intermittent receiving operations.

Furthermore, in FIG. 1, a ROM 15 stores a plurality of preheat times or timing information corresponding to these pre-heat times which are arbitrarily selectable. The pre-heat time used in this embodiment is an ideal pre-heat time suitable for the cycle of the (later-described) intermittent receiving operation being received or set by the receiver. A second intermittent cycle generating section 17 changes the generation cycle and the pre-heat time of the second intermittent cycle generation timing signal 19 sent to the second regulator circuit 21 in accordance with the cycle of the intermittent operation to be performed.

Cycle information of the intermittent receiving operation is included in the control information received from the base station during the operation of receiving circuit 8. Based on the information designating the cycle of the intermittent receiving operation, the operation of first and second intermittent cycle generating sections 16 and 17 is controlled. And, the pre-heat time is determined (changed) correspondingly. Data processing section 14 determines (changes) the timing of first intermittent cycle generation timing signal 18 sent out from first intermittent cycle generating section 16 in accordance with the intermittent operating cycle involved in the control information received from the base station.

Furthermore, a timing setting section 36, constituted by a delay circuit, a counter, an internal memory, or other circuit, is added to the data processing section 14 for determining (changing) the timing and/or length of the pre-heat time to be added to the second intermittent cycle generation timing signal 19.

Alternatively, instead of providing the above-described timing setting section 36, it will be preferable that data processing section 14 selectively reads out the necessary timing information from ROM 15. In this case, the timing information read out from ROM 15 is a pre-heat time determined based on the intermittent operating cycle which is presently received or set as an initial value. The readout timing information is used to generate the second intermittent cycle generation timing signal 19 in the second intermittent cycle generating section 17. Of course, it is also preferable that the control information sent from the base station includes or designates the pre-heat time or the timing information corresponding to this pre-heat time.

More specifically, the pre-heat time can be set adequately in data processing section 14 based on the intermittent operating cycle determined beforehand as initial settings or the like. Or, alternatively, the timing information relating to the pre-heat time corresponding to this intermittent operating cycle can be automatically selected from ROM 15. For example, when the intermittent operation receiver itself is first turned on, it will be preferable to automatically select this pre-heat time prepared beforehand or immediately available. Subsequently, the cycle of the intermittent receiving operation can be varied according to the above-described operation in response to the cycle information of the intermittent receiving operation sent from the base station.

Returning to FIG. 1, a reference oscillator 1 generates a reference frequency. A phase-locked loop IC (PLLIC) 2 starts its operation upon receiving second power voltage 23, and compares the reference frequency supplied from reference oscillator 1 and an oscillation frequency Ff supplied from a voltage-controlled oscillator (VCO) 5, and then generates a voltage Vf(3) serving as a frequency control voltage based on the comparison result. A low-pass filter (LPF) 4 receives the voltage Vf and outputs EL voltage Vs. Voltage-controlled oscillator (VCO) 5 starts its operation upon receiving second power voltage 23 and generates the oscillation frequency Ff in accordance with voltage Vs fed from low-pass filter 4. This oscillation frequency Ff is fed back to phase-locked loop IC 2 to perform the frequency control. Voltage-controlled oscillator (VCO) 5 generates a local oscillation frequency Fi and sends it to a phase shifter 6. Phase shifter 6 receives the local oscillation frequency Fi generated from voltage-controlled oscillator 5, and outputs local signals 25 and 26 whose phases are offset 90° from each other. These local signals 25 and 26 are sent to orthogonal mixer 12.

In the circuit diagram of FIG. 2 showing the low-pass filter 4 (FIG. 1), R1, R2, R3 and R4 are stationary resistances and C1, C2 and C3 are capacitors. Two resistances R1 and R2 and one capacitor C1 cooperatively constitute a lag-lead filter. Resistance R3 and capacitor C2 cooperatively constitute a lag filter. Similarly, resistance R4 and capacitor C3 cooperatively constitute another lag filter. Accordingly, the low-pass filter 4 of the present embodiment comprises one stage of a lag-lead filter and two stages of a lag filter.

As understood from the above-described arrangement of PLL circuit 7, voltage Vf(3) generated from PLLIC 2 cannot be entered into voltage-controlled oscillator 5 unless it passes through low-pass filter 4. In other words, characteristics of low-pass filter 4 restricts the switching time of frequency from being set shorter than the time constant of low-pass filter 4. Hence, the following problem is raised.

Namely, when the intermittent operating cycle is extended, capacitor C1 constituting part of the above-described lag-lead filter of low-pass filter 4 continuously loses its charge since charge leaks through a variable capacitor positioned at the input side of voltage-controlled oscillator 5, capacitors of low-pass filter 4, and a printed board. If the leakage amount of charge is large, it will take a fairly long time to recharge the capacitor C1 of the lag-lead filter when the PLL circuit 7 is again supplied with electric power. As a result, the frequency stabilization time is elongated.

Referring to FIG. 3, it is understood that the frequency stabilization time (t), which causes a change along an ascending curve, is elongated or delayed with increasing intermittent operating cycle T (i.e. when the intermittent operating cycle shifts right in the drawing as shown successively by mT and nT). For example, the magnitude of the frequency stabilization time is "t" when the intermittent operating cycle is T, and "t'" when the intermittent operating cycle is mT.

When the intermittent operating cycle is T or mT, its pre-heat time needs to be higher than the frequency stabilization time t or t' (i.e. longer than the frequency stabilization time t or t'). Hence, it is ideal that the pre-heat time is set at the position t1 or t2, respectively, as shown in FIG. 3. However, as described previously, the efficiency in the power supply operation will be worsened if this pre-heat time t1 or t2 is set far from its corresponding frequency stabilization time t or t'. Accordingly, it is desirable that the pre-heat time t1 or t2 is set above but not far from its corresponding frequency stabilization time t or t'.

Next, an operation of the intermittent operation receiver in accordance with the present embodiment will be explained with reference to FIGS. 1 through 4.

As described previously, data processing section 14 receives the control information sent from the base station and determines (changes) the intermittent operating cycle on the basis of the received signal. Or, although determined as initial settings, data processing section 14 generates the timing information relating to the pre-heat time corresponding to its own determining intermittent operating cycle by its timing setting section 36. Otherwise, the timing information relating to the pre-heat time can be read out from ROM 15. Second intermittent cycle generating section 17 generates the second intermittent cycle generation timing signal 19 which reflects the pre-heat time (whose value might be varied in accordance with the previous or pre-received intermittent operating cycle) and then sends this second intermittent cycle generation timing signal 19 to second regulator circuit 21.

Second regulator circuit 21 generates second power voltage 23 including the pre-heat time which might be modified based on second intermittent cycle generation timing signal 19 and sends it to PLLIC 2 and voltage-controlled oscillator 5 of PLL circuit 7, thereby activating PLL circuit 7 and starting the pre-heat time. The start timing of PLL circuit 7 is shown by the buildup of operation timing ti and t2 (FIG. 3) of PLL circuit 7 (i.e. operation timing of the second power voltage 23) shown in FIGS. 4A and 4B. FIG. 4A is a timing chart showing the operation of the receiving circuit (relating to first power voltage 22) where the intermittent receiving operation is operation by the cycle T. FIG. 4B is a timing chart showing the operation of the receiving circuit where the intermittent receiving operation is operation by the cycle mT.

The intermittent operating cycle mT shown in FIG. 4B is longer than the intermittent operating cycle T shown in FIG. 4A. Hence, the frequency stabilization time t' of PLL circuit 7 shown in FIG. 4B becomes longer than the frequency stabilization time t of PLL circuit 7 shown in FIG. 4A. For this reason, the pre-heat time (t2 of FIG. 3) used in the intermittent operation of FIG. 4B is set longer than the pre-heat time (t1 of FIG. 3) used in the intermittent operation of FIG. 4A. The length difference between these two pre-heat times is determined based on the length difference of power voltages 23, i.e. the difference of the intermittent operating cycles. Relationship between intermittent operating cycles mT and T and frequency stabilization times t' and t as well as pre-heat times t2 and t1 is shown in FIG. 3, as described previously.

In this manner, PLL circuit 7 can be always built up early or timely and subjected to a sufficient pre-heat operation no matter what kind of intermittent operating is performed since PLL 7 is activated by the optimum pre-heat time which is adequately variable in accordance with the selected or designated intermittent operating cycle to be performed. Hence, the data fetching can be surely executed after the frequency convergence is sufficiently stabilized.

After the pre-heat time has elapsed, first intermittent cycle generating section 16 generates first intermittent cycle generation timing signal 18 to first regulator circuit 20. First regulator circuit 20 supplies first power voltage 22 to RF amplifier 11, orthogonal mixer 12 and demodulation IC 13 so that receiving circuit 8 can start its operation at the timing shown in FIGS. 4A and 4B.

More specifically, in response to supplying of the first power voltage 22, the radio frequency signal received by antenna 10 is amplified by RF amplifier 11. The amplified input signal is orthogonally resolved into the base-band I and Q signals in orthogonal mixer 12 under the control of local signals 25 and 26 fed from phase shifter 6 of PLL circuit 7. Then, the base-band I and Q signals are detected and demodulated in demodulation IC 13 into an NRZ (non return to zero) signal 24, and are subsequently sent out to decoder 9, in the same manner as in the conventional intermittent operation receiver. Based on the decoded NRZ signal 24, data processing section 14 checks the control information involving the intermittent operating cycle to control both of first intermittent cycle generating section 16 and second intermittent cycle generating section 17.

Controlling the pre-heat time of PLL circuit 7 in accordance with- the designated or selected intermittent operating cycle makes it possible to prevent the PLL circuit from starting its receiving operation (data fetching operation) prematurely before its frequency convergence is completely stabilized, causing erroneous signal reception, or makes it possible to prevent the PLL circuit from being activated early unnecessarily and wasting a large amount of electric current. Thus, an ideal power saving can be realized from use of the apparatus, resulting in the desirable lengthen of the lifetime of batteries.

Although the above-described embodiment discloses the intermittent operation receiver of the present invention applied to a direct-conversion type receiver, the present invention can be applied to another system, for example, combining an ordinary heterodyne system and a PLL circuit, since a significant time is always required to stabilize the frequency convergence of the PLL circuit in such a system too. In other words, the present invention can be applied to any type of intermittent operation receiver if it uses a PLL circuit.

As explained above, the arrangement of the present, invention realizes the intermittent operation receiver capable of determining (changing) the timing information relating to the pre-heat time of the PLL circuit by the data processing section in accordance with the modified intermittent operating cycle received from the base station, or capable of reading out the same from the ROM. Hence, the PLL circuit can perform its receiving operation in a stable frequency convergence condition no matter how the intermittent operating cycle is changed. Any redundant pre-heat time of the PLL circuit can be eliminated, resulting in a desirable elongation of the lifetime of the batteries and heightening of the efficiency in the power supply operation.

As this invention may be embodied in several forms without departing from the spirit of essential characteristics thereof, the present embodiment described is therefore intended to be only illustrative and not restrictive, since the scope of the invention is defined by the appended claims rather than by the description preceding them, and all changes that fall within metes and bounds of the claims, or equivalents of such metes and bounds, are therefore intended to be embraced by the claims.

What is claimed is:

1. An intermittent operation receiver comprising:

a receiving circuit for receiving a control signal including at least one of plural intermittent operating cycles and data transmitted from a base station, and for generating a demodulated signal;

a PLL circuit including a voltage-controlled oscillator for generating two kinds of local signals having a 90° phase difference which are sent to said receiving circuit to control processing of received signals; and a data processing section for receiving said demodulated signal from said receiving circuit, decoding said data and processing said control signal to generate a first intermittent cycle generation timing signal including a period corresponding to a designated intermittent operating cycle of said control signal, and sending out said first intermittent cycle generation timing signal to said receiving circuit to control a power supply for said receiving circuit, said data processing section selectively determining a pre-heat time in accordance with an intermittent operating cycle derived from said control signal, and generating a second intermittent cycle generation timing signal for timing said pre-heat time and generating said second intermittent cycle generation timing signal to said PLL circuit to control a power supply for said PLL circuit, thereby changing said pre-heat time of said PLL circuit in accordance with any modified intermittent operating cycle sent from said base station.

2. The intermittent operation receiver in accordance with claim 1, further comprising a ROM for storing timing information for plural pre-heat times corresponding to said plural intermittent operating cycles, wherein said data processing section reads out timing information from said ROM relating to a pre-heat time for a designated intermittent operating cycle when intermittent operation cycle information is received from said base station, thereby determining timing for said intermittent cycle generation timing signal.

3. The intermittent operation receiver in accordance with claim 1, wherein said data processing section comprises a means for setting an initial intermittent operating cycle, so that said first and second intermittent cycle generation timing signals are determined in accordance with said initial intermittent operating cycle.

4. The intermittent operation receiver in accordance with claim 1, wherein said receiving circuit comprises:

a first regulator circuit for receiving said first intermittent cycle generation timing signal from said data processing section and supplying a first power voltage to said receiving circuit in response to a timing of said first intermittent cycle generation timing signal, and a second regulator circuit for receiving said second intermittent cycle generation timing signal from said data processing section and supplying said PLL circuit with a second power voltage involving said pre-heat time in response to a timing of said second intermittent cycle generation timing signal.

* * * * *